United States Patent
Han

(10) Patent No.: US 7,880,311 B2
(45) Date of Patent: Feb. 1, 2011

(54) STACKED SEMICONDUCTOR PACKAGE AND METHOD FOR MANUFACTURING THE SAME

(75) Inventor: Kwon Whan Han, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 443 days.

(21) Appl. No.: 11/953,134

(22) Filed: Dec. 10, 2007

(65) Prior Publication Data

US 2009/0108468 A1    Apr. 30, 2009

(30) Foreign Application Priority Data

Oct. 30, 2007  (KR) .................. 10-2007-0109766

(51) Int. Cl.
    *H01L 23/48*    (2006.01)
(52) U.S. Cl. .................. 257/777; 257/774; 257/775; 257/686
(58) Field of Classification Search .......... 257/770–779
    See application file for complete search history.

(56) References Cited

U.S. PATENT DOCUMENTS

| 6,903,442 B2 | 6/2005 | Wood et al. |
| 6,955,982 B2 * | 10/2005 | Jimarez et al. ............ 438/616 |
| 2005/0046002 A1 | 3/2005 | Lee et al. |
| 2006/0057775 A1 | 3/2006 | Shao et al. |
| 2007/0052067 A1 * | 3/2007 | Umemoto ................ 257/587 |

FOREIGN PATENT DOCUMENTS

| CN | 1577840 A | 2/2005 |
| CN | 101047167 A | 10/2007 |
| JP | 2007-201512 A | 8/2007 |
| KR | 1020030055834 A | 7/2003 |

* cited by examiner

*Primary Examiner*—Leonardo Andújar
(74) *Attorney, Agent, or Firm*—Ladas & Parry LLP

(57) ABSTRACT

A stacked semiconductor package includes a semiconductor chip module including at least two semiconductor chips, each semiconductor chip having a first face, a second face opposite to the first face, and a circuit part. A thorough portion passes through the first and second faces of the semiconductor chip. A recess part is formed in a portion of the second face where the second face and the through portion meets. A through electrode is electrically connected to the circuit part and is disposed inside of the through portion. A connection member is disposed in the recess part to electrically connect the through electrodes of adjacent stacked semiconductor chips. And the semiconductor chip module is mounted to a substrate. The stacked semiconductor package prevents both gaps between semiconductor chips and misalignment of the through electrode.

10 Claims, 5 Drawing Sheets

STACKED SEMICONDUCTOR PACKAGE AND METHOD FOR MANUFACTURING THE SAME

CROSS-REFERENCE TO RELATED APPLICATIONS

The present application claims priority to Korean patent application number 10-2007-0109766 filed on Oct. 30, 2007, which is incorporated herein by reference in its entirety.

BACKGROUND OF THE INVENTION

The present invention relates to a stacked semiconductor device and a method for manufacturing the same.

Recent developments in semiconductor fabrication technology have lead to various types of semiconductor packages having a semiconductor device adapted to process massive amounts of data in a short period of time.

A semiconductor package is typically fabricated using the following processes: a semiconductor chip fabrication process for fabricating a semiconductor chip including a semiconductor device over a wafer made of high quality pure silicon, a die sorting process for electrically inspecting the semiconductor chip, and a packaging process for packaging the semiconductor chips that pass the inspection process.

Additionally, recent technological advancements have lead to a chip scale package having a size that is only 100% to 105% of the size of a semiconductor chip, and a stacked semiconductor package in which a plurality of semiconductor chips are stacked in order to enhance the data capacity and the processing speed of a semiconductor device.

Additional developments include a semiconductor product in which a plurality of semiconductor chips are stacked to enhance a data capacity and processing speed, as well as a semiconductor product in which the integration density of the semiconductor chip is enhanced in order to enhance the data capacity and the processing speed.

SUMMARY OF THE INVENTION

Embodiments of the present invention are directed to a stacked semiconductor package that prevents misalignment of through electrodes that are included in a plurality of stacked semiconductor packages. As such, a gap between the stacked semiconductor packages is removed, thereby decreasing the volume of the stacked semiconductor package.

Additionally, embodiments of the present invention are directed to a method for fabricating the aforementioned stacked semiconductor package.

In one embodiment, a stacked semiconductor package comprises a semiconductor chip module including at least two semiconductor chips each semiconductor chip having a first face, a second face opposite to the first face, and a circuit part. The semiconductor chip further comprises a through portion passing through the first and the second faces, and a recess part formed in a portion of the second face where the second face and the through portion meet. A through electrode is electrically connected to the circuit part, and the through electrode is disposed inside of the through portion. A connection member is disposed in the recess part to electrically connect the through electrodes of adjacent stacked semiconductor chips. The semiconductor chip module is mounted to a substrate.

The connection member may be disposed over the first end portion of the through electrode.

Alternatively, the connection member may be disposed over the second end portion of the through electrode.

The connection member may include a solder.

Alternatively, the connection member may include a resin and conductive balls included in the resin.

The portion of the semiconductor chip body corresponding to the recess part may have a curved surface.

Alternatively, the portion of the semiconductor chip body corresponding to the recess part may have a flat bottom surface.

The second end portion of the through electrode is disposed at a position above the second face.

The first end portion of the through electrode is projected from the first face.

The semiconductor chips stacked over the substrate are in direct contact with each other.

In another embodiment, a method for fabricating a stacked semiconductor package comprises forming a through portion that passes through a first face and a second face that is opposite to the first face of a semiconductor chip; forming a through electrode in the through portion, the through electrode having a first end portion corresponding to the first face and a second end portion opposite the first end portion; patterning the second face of the semiconductor chip in a vicinity of a second end portion of the through electrode that is exposed to form a recess part for exposing some portion of a side surface of the through electrode; forming a connection member on one of the first end portion and the second end portion of the through electrode; and mounting the through electrode of the semiconductor chip to a connection pad of the substrate.

The method for fabricating a stacked semiconductor package may further comprise, before the step of forming the through electrode, the step of forming an insulation layer pattern on inside surfaces of the through portion.

In the step of forming the through electrode, the through electrode is projected from the first face to some length and the projected length is less than the depth of the recess part.

The recess part is formed by one of a wet etching process and a dry etching process.

In the step of forming the recess part, a portion of the second end portion of the through electrode is etched together with the recess part, such that the second end portion of the through electrode is at a position above the second face of the semiconductor chip.

In the step of forming the connection member, a solder paste may be filled in the recess part.

Alternatively, in the step of forming the connection member, the connection member is an anisotropic conductive member including a resin and conductive balls included in the resin.

In the step of mounting the semiconductor chip over the substrate, at least two semiconductor chips are mounted over the substrate.

In the step of forming the connection member, the connection member may be formed over the first end portion.

Alternatively, in the step of forming the connection member, the connection member may be formed over the second end portion.

DESCRIPTION OF SPECIFIC EMBODIMENTS

Figure 1:
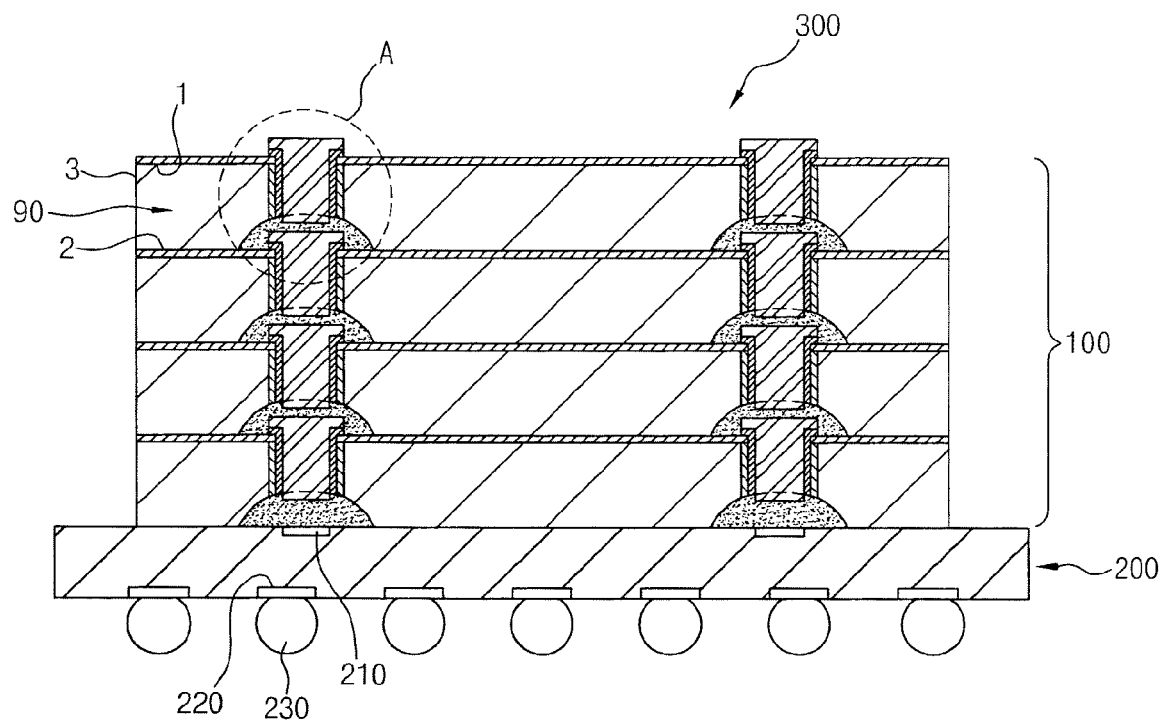
FIG. 1 is a cross-sectional view showing a stacked semiconductor package in accordance with an embodiment of the present invention.
Figure 2:
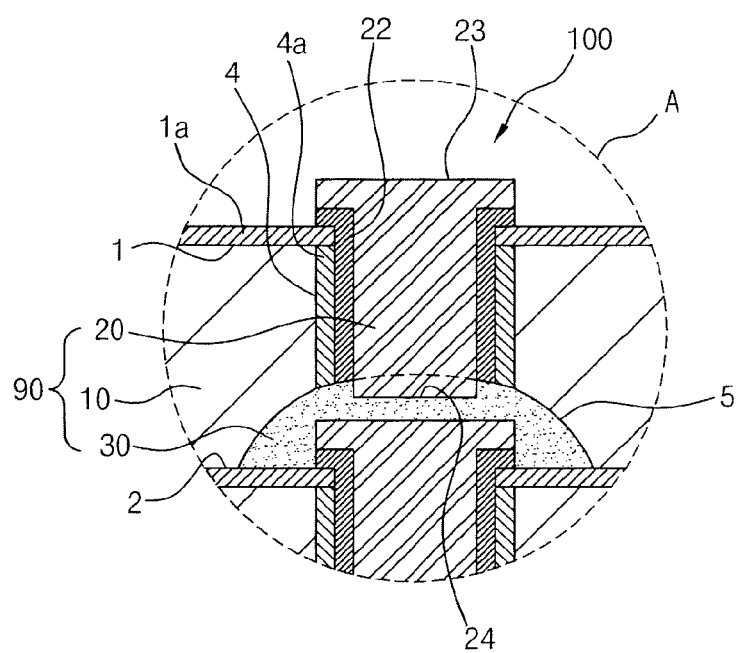
FIG. 2 is an enlarged view of portion 'A' in FIG. 1.

FIG. 1 is a cross-sectional view illustrating a stacked semiconductor package in accordance with an embodiment of the present invention. FIG. 2 is an enlarged view of portion 'A' in FIG. 1.

Referring to FIGS. 1 and 2, the stacked semiconductor package 300 includes a semiconductor chip module 100 and a substrate 200.

The semiconductor chip module 100 includes at least two semiconductor chips 90 and the semiconductor chips 90 are stacked over each other.

Each semiconductor chip 90 includes a semiconductor chip body 10, a through electrode 20 and a connection member 30.

Figure 6:
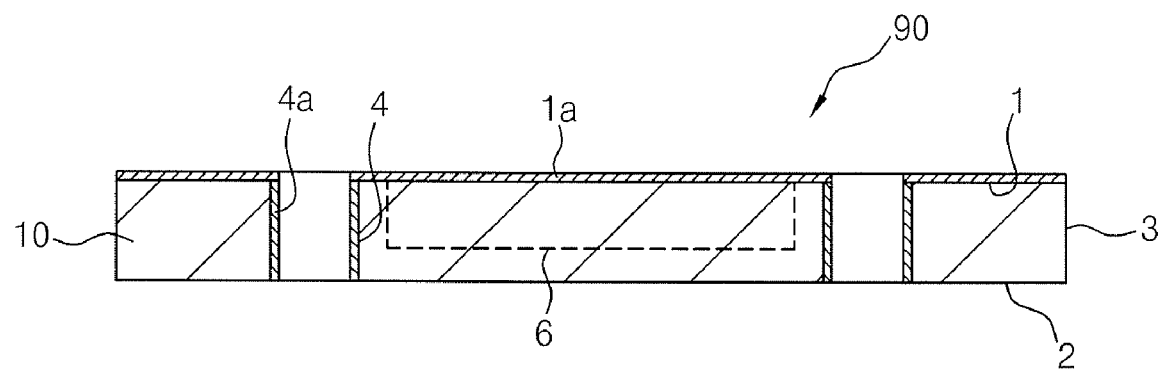
FIGS. 6 through 9 are cross-sectional views illustrating the steps of a method for fabricating a stacked semiconductor package in accordance with an embodiment of the present invention.

The semiconductor chip body 10 includes a first face 1, a second face 2, side faces 3, through portion 4, recess part 5, and a circuit portion 6 (not shown in FIGS. 1 and 2, see FIG. 6).

The first face 1 of the semiconductor chip body 10 is opposite to the second face 2, and the side faces 3 connect the first face 1 and the second face 2 of the semiconductor chip body 10. In the present embodiment, the semiconductor chip body 10 may have, for example, a rectangular parallelepiped shape, and the semiconductor chip body 10 includes four side faces 3.

A protective layer 1a is disposed over the first face 1 of the semiconductor chip body 10. The protector layer 1a may be an oxide layer and/or a nitride layer. Alternatively, the protective layer 1a may also be an organic layer.

The through portions 4 pass through the first face 1 and the second face 2 of the semiconductor chip body 10. The through portion 4 has a circular shape when viewed from above. However, alternative shapes of the through portion 4 may be used, such as a rectangle or a polygon. rather than the circular shape. The through portion 4 may be disposed an edge of the semiconductor chip body 10.

An insulation layer 4a is disposed over an inner surface of the semiconductor chip body 10 in the through portion 4. The insulation layer 4a may be an oxide layer and/or a nitride layer. Alternatively, the insulation layer 4a may also be an organic layer.

Figure 3:
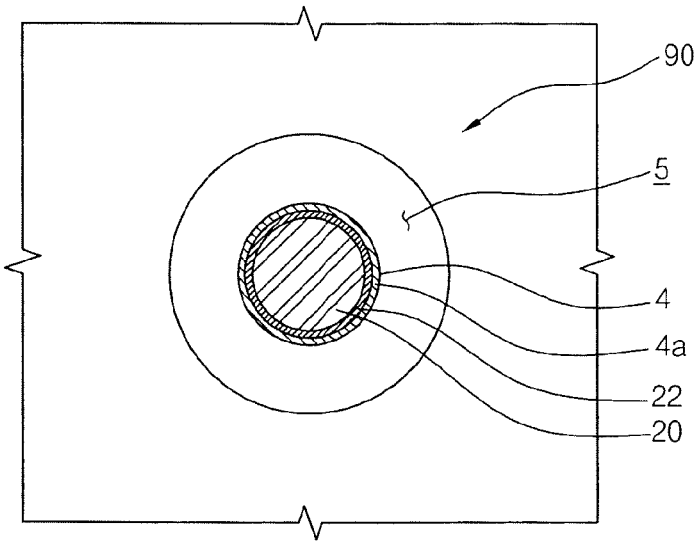
FIG. 3 is a plan view showing the recess part and the through electrode of the semiconductor chip module shown in FIG. 1.

FIG. 3 is a plan view illustrating the recess part and through electrode of the semiconductor chip shown in FIG. 1.

Referring to FIGS. 2 and 3, the recess part 5 is formed, for example, over the second face 2. The recess part 5 is formed where the through portion 4 and the second face 2 meets, and the recess part 5 exposes a side surface of the through electrode 20.

The recess part 5 formed over the second face 2 may have, for example, a hemispherical shape. Alternatively, the recess part 5 formed over the second face 2 may also have a rectangular groove shape with a flat bottom surface. In the present embodiment, the recess part 5 is connected to the second face 2 of the semiconductor chip body 10, and thus an inlet of the through portion 4 is enlarged.

A circuit part (not shown) is disposed at a center of the semiconductor chip body 10. The circuit part includes a data storage part (not shown) for storing data and a peripheral circuit part (not shown) for processing the data.

Referring to FIG. 2, the through electrode 20 is disposed within the through portion 4. The through electrode 20 includes a metal seed layer 22, and the metal seed layer 22 is disposed over the insulation layer 4a. Examples of material that may be used as the metal seed layer 22 include titanium, nickel, vanadium, copper, etc.

The through electrode 20 is disposed over the metal seed layer 22, and the through electrode 20 has a pillar shape. Examples of material that may be used as the through electrode 20 include copper, etc.

A first end portion 23 of the through electrode 20 projects form the first face 1 of the semiconductor chip body 10 at a predetermined length. In the present embodiment, the projected length of the first end portion 23 of the through electrode 20 is less than the depth of the recess part 5.

Meanwhile, a second end portion 24 of the through electrode 20, which is opposite to the first end portion 23, may also project form the through portion 4 at a predetermined length An exposing portion of the through electrode, which has the second end portion 24 and portion of a side face that meets the second end portion 24, is disposed in the recess part 5.

In the present invention, if the second end portion 24 of the through electrode 20 is disposed at the position above the second face 2, it is possible to prevent the formation of gap between adjacent semiconductor chips 90 when stacking the semiconductor chips 90.

As such, in the present invention a gap is not formed between adjacent semiconductor chips 90, and the adjacent semiconductor chips 90 are therefore in direct contact with each other. It is therefore possible to decrease the volume of the semiconductor chip module 100 and also prevent various process defects caused by the space between the semiconductor chips 90.

The connection member 30 electrically connects the through electrodes 20 in a pair of adjacent semiconductor chips 90.

As an example, the connection member 30 can be a low melting point metal electrically connecting the through electrodes 20 in a pair of adjacent semiconductor chips 90. In the present embodiment the low melting point metal can be melted at a temperature that is lower than the melting point of the through electrode 20. In the present invention, examples of material that may be used as the connection member 30 include solder, etc.

In the present invention, when the through electrodes 20 of a pair of adjacent semiconductor chips 90 are connected via the connection member 30, the connection member 30 has a volume that is smaller than the volume of the recess part 5 so that when the connection member 30 is filled in the recess part 5 overflow outside of the recess part is prevented.

The connection member 30 may also be an anisotropic conductive member that electrically connects the through electrodes 20 of the adjacent semiconductor chips 90. The anisotropic conductive member includes an insulation resin and conductive balls having a fine diameter, and the conductive balls are mixed or aligned with the insulation resin.

Referring to FIGS. 1 and 2, the connection member 30 including the solder or the anisotropic conductive member (which connects electrically the through electrodes 20 of the pair of the adjacent semiconductor chips 90) may be disposed, for example, inside of the recess part 5 of an upper semiconductor chip 90 of the pair of adjacent semiconductor chips 90.

The connection member 30 that is disposed inside the recess part 5 of the upper semiconductor chip 90 ( and including the solder or the anisotropic conductive member) is electrically connected to the first end portion 23 of the through electrode 20 that projects from the first face 1 of the lower semiconductor chip 90 (i.e. the lower of the semiconductor chips in the pair of semiconductor chips).

In the present invention, the substrate 200 has a plate shape, and may be a printed circuit board (PCB). The semiconductor chip module 100 is mounted over the substrate 200.

In order to mount the semiconductor chip module 100 over the substrate 200, a connection pad 210 is disposed in an upper face of the substrate 200, and a ball land pattern 220 is disposed on a lower face that is opposite to the upper face of the substrate 200. A solder paste may be disposed at the connection pad 210.

The connection pad 210 of the substrate 200 is disposed at a position corresponding to the through electrode 20 of the semiconductor chip 100. The connection pad 210 and the through electrode 20 are electrically connected via the connection member 30 disposed in the recess part 5.

The ball land pattern 220 is electrically connected to the connection pad 210, and a conductive ball 230, such as a solder ball, is attached to the ball land pattern 220.

Figure 4:
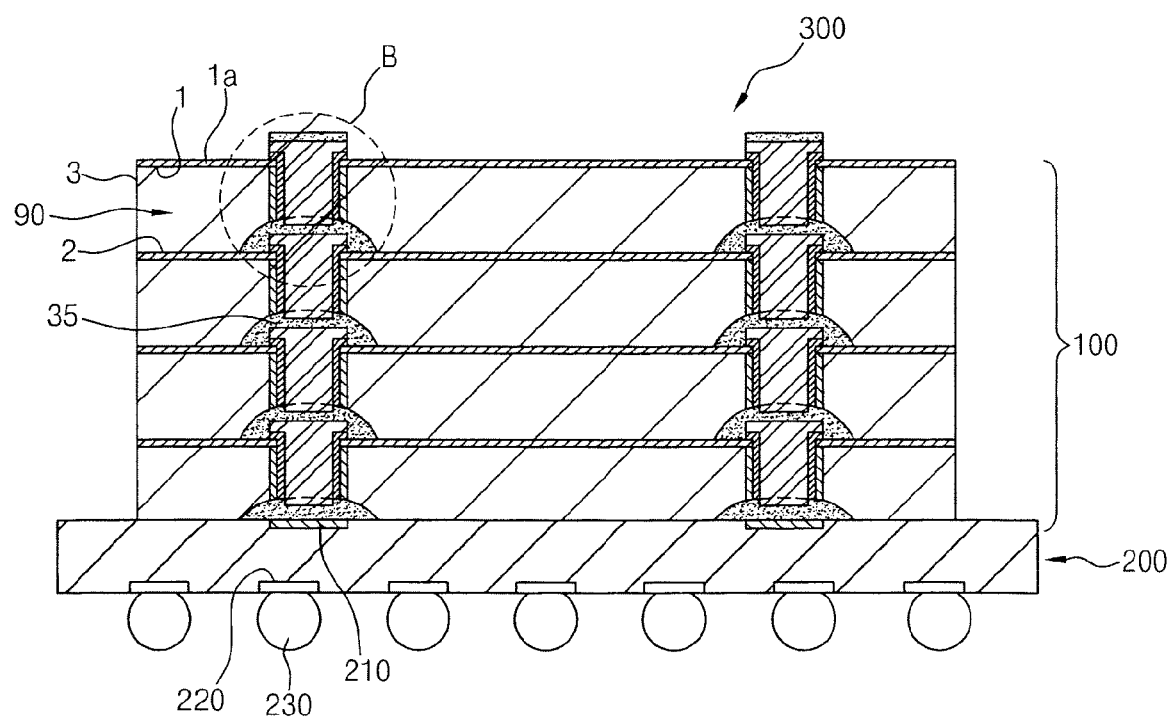
FIG. 4 is a cross-sectional view showing a stacked semiconductor package in accordance with another embodiment of the present invention.
Figure 5:
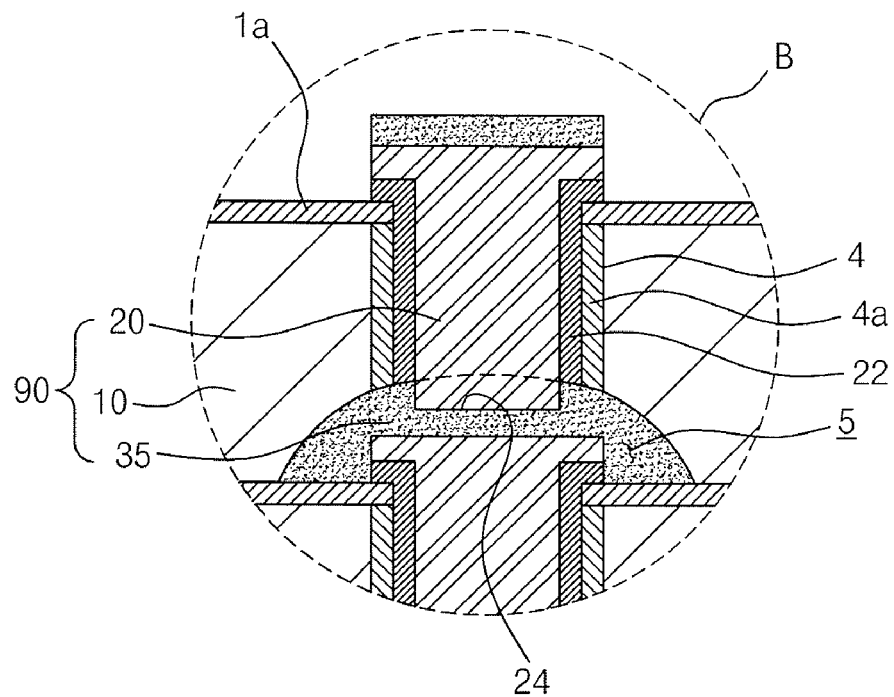
FIG. 5 is an enlarged view of portion 'B' in FIG. 4.

FIG. 4 is a cross-sectional view illustrating a stacked semiconductor package in accordance with another embodiment of the present invention. FIG. 5 is an enlarged view of portion 'B' in FIG. 4. The embodiment of the present invention shown in FIG. 4 has substantially the same structure as the stacked semiconductor package described with reference to FIGS. 1 through 3 except for the connection member. Therefore, descriptions of the same components will be omitted, and the names and reference symbols of the same components will be given the same number.

Referring to FIGS. 4 and 5, a stacked semiconductor package 300 includes a semiconductor chip module 100 and a substrate 200.

The semiconductor chip module 100 includes a plurality of semiconductor chips 90, and each semiconductor chip 90 includes a through portion 4, a recess part 5, a through electrode 20, and a connection member 35.

The connection member in accordance with the present embodiment is formed, for example, optionally over a first end portion 23 of the through electrode 20.

The connection member 35 formed optionally over a first end portion 23 of the through electrode 20 includes a low melting point metal that electrically connects the through electrodes 20 of a pair of adjacent semiconductor chips 90. In the present embodiment the low melting point metal melts at a temperature lower than the melting point of the through electrode 20. In the present invention, examples of materials that may be used for the connection member 35 include solder, etc.

In the present invention, when the through electrodes 20 of the pair of adjacent semiconductor chips 90 are connected to each other via the connection member 35, the connection member 35 has a suitable volume that prevents a vacant space form being formed within the recess part 5.

The connection member 35 may also be an anisotropic conductive member that electrically connects the through electrodes 20 of the pair of adjacent semiconductor chips 90. The anisotropic conductive member includes an insulation resin and conductive balls with a fine diameter, and the conductive balls are either mixed or aligned with the insulation resin.

FIGS. 6 through 9 are cross-section views illustrating the process steps of a method for fabricating a stacked semiconductor package in accordance with an embodiment of the present invention.

Referring to FIG. 6, a through portion 4 is formed at either edge or both edges of the semiconductor chip 90, and passes through the semiconductor chip body 10 (which has a rectangular parallelepiped shape) and the protective layer 1a. The through portion 4 may be formed, for example, using a drilling process or a laser drilling process.

An insulation layer 4a is formed in the through portion 4 on an inner surface of the semiconductor chip body 10. Examples of materials that may be used as the insulation layer 4a include an oxide layer, a nitride layer, and an organic layer. The reference symbol 6 indicates a circuit part disposed in the center of the semiconductor chip body 10.

Figure 7:
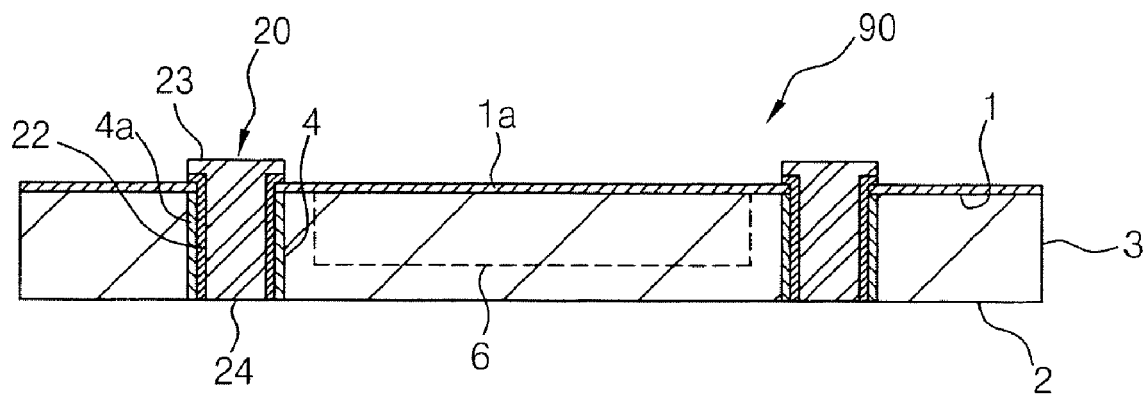

Referring to FIG. 7, after the insulation layer 4a is formed in the through portion over the inner surface of the semiconductor chip body 10, a metal seed layer 22 is formed over the surface of the insulation layer 4a. The metal seed layer 22 may be formed using an electroless plating process or a sputtering process. Examples of material that may be used as the metal seed layer 22 include titanium, nickel, vanadium, copper, etc. The metal seed layer 22 is extended over a portion of protective layer 1a that is in the vicinity of the through portion 4.

After the metal seed layer 22 is formed, the through electrode 20 is formed in an inside of the through portion 4 using the metal seed layer 22. The through electrode 20 is formed. The through electrode may be formed using a plating process that uses the metal seed layer 22. An example of a material that may be used as the through electrode 20 is copper.

The through electrode 20 is formed to have a pillar shape with a first end portion 23 of the through electrode 20 being projected from the first face 1 of the semiconductor chip body 10. The through electrode is formed such that the second end portion 24 of the through electrode 20, which is opposite to the first end portion 23, is on the same plane as the second face 2.

Figure 8:
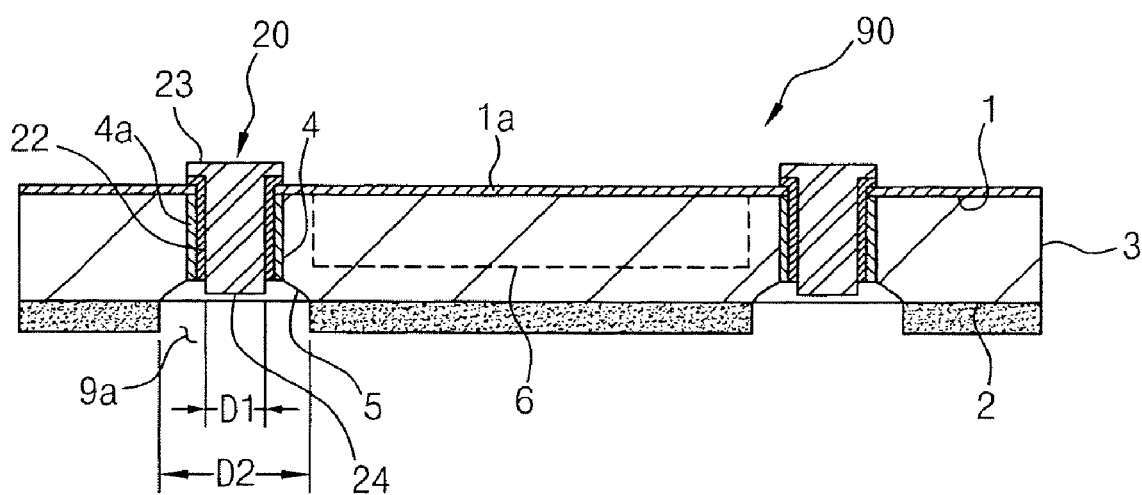

Referring to FIG. 8, after the through electrode 20 is formed within the through portion 4, a photoresist film (not shown) is formed over the second face 2 of the semiconductor chip body 10. The photoresist film is patterned using a photo process, which includes a photolithography process and a development process, to form a photoresist pattern 9 over the second face 2 of the semiconductor chip body 10.

The photoresist pattern 9 has an opening for exposing the through electrode 20. The through electrode 20 has a first diameter D1, and the opening 9a has second diameter D2 that is larger then the first diameter D1.

The second face 2 of the semiconductor chip body 10 is patterned using the photoresist pattern 9 as an etching mask, and thus the recess part 5, which exposes a side surface of the through electrode 20, is formed in the second face 2 of the semiconductor chip body 10. The through portion 4 that meets with the second face 2 is enlarged by the recess part 5.

In the present embodiment, the second face 2 of the semiconductor chip body 10 is patterned using an anisotropic etching process, and thereby the surface of the recess part 5 can have a curved shaped.

Meanwhile, the second end portion 24 of the through electrode 20 is also etched when the recess part 5 is formed in the second face 2 of the semiconductor chip body 10, and thus the second end portion 24 of the through electrode 20 is disposed at a portion above the second face 2 of the semiconductor chip body 10. Alternatively, the recess part 5 formed in the second face 2 of the semiconductor chip body 10 may be patterned using an isotropic etching process, and thus the bottom surface of the recess part 5 may also have a flat surface.

Figure 9:
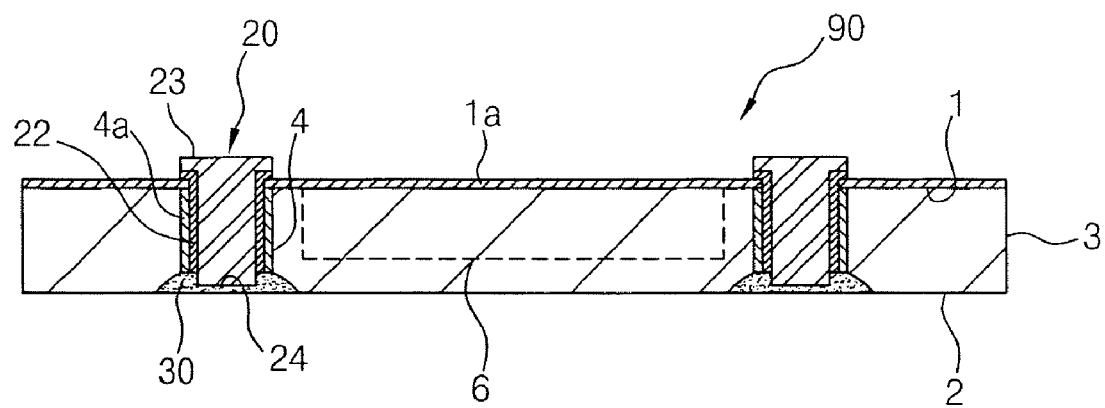

Referring to FIG. 9, the connection member 30 is disposed inside the recess part 5 (which is formed in the second face 2 of the semiconductor chip body 10), thereby completing the fabrication of the semiconductor chip 90. In the present embodiment, the connection member 30 includes a metal having a melting point lower than that of the through electrode 20. Examples of material that may be used as the connection member 30 include solder, etc.

Alternatively, an anisotropic conductive member including a resin and fine conductive balls that are included in the resin may be disposed inside of the recess part 5 formed in the second face 2 of the semiconductor chip body 10.

In the present embodiment, by forming the recess part 5, which exposes the side surface of the through electrode 20, in the second face 2 of the semiconductor chip body 10, and by forming the conductive connection member 30 inside of the recess part 5, it is possible to reduce the generation of a misalignment in the through electrode 20 when stacking a plurality of the semiconductor chips 90.

The connection member 30 of the semiconductor chip 90 shown in FIG. 9 may be electrically connected to the connection pad 210 of the substrate 200 as shown in FIG. 1.

The connection members 30 of a plurality of the semiconductor chips 90 are electrically connected to each other and placed over the substrate 200, an thereby the stacked semiconductor package is fabricated.

Figure 10:
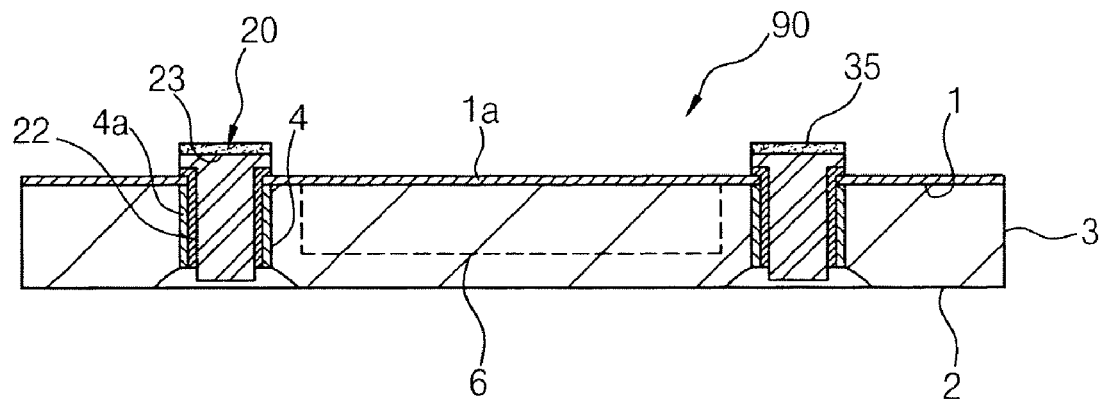
FIG. 10 is a cross-sectional view illustrating a connection member in a semiconductor chip in accordance with another embodiment of the present invention.

FIG. 10 is a cross-sectional view showing a connection member of a semiconductor chip in accordance with another embodiment of the present invention.

In the present embodiment, a connection member 35 may be optionally disposed on a first end portion 23 of the through electrode 20. The through electrodes 20 of a plurality of semiconductor chips 90 are electrically connected via the connection member 35 (which is optionally formed at the first end portion 23 of the through electrode 20), and the through electrodes 20, which are electrically connected to each other via the connection member 35, are electrically connected to a connection pad 210 of the substrate 200 using a solder.

As is apparent from the above description, in the present invention, because: the through electrode which passes through the semiconductor chip is formed; and thereafter the recess part exposing the side surface of the through electrode is formed, and the conductive connection member is formed within the recess part; and the through electrodes of a plurality of the semiconductor chips are electrically connected using the connection member; the present invention has an advantage in that gaps between the semiconductor chips are prevented, and also the generation of a misalignment in the through electrode of the semiconductor chip is prevented.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A stacked semiconductor package, comprising:
a semiconductor chip module including at least two semiconductor chips that are stacked, wherein each of the semiconductor chips have a first face, a second face opposite to the first face, and a circuit part, each semiconductor chip comprising:
a through portion passing through the first and the second faces,
a recess part formed in a portion of the second face of the semiconductor chip where the second face and the through portion meet,
a through electrode having a first end portion and a second end portion opposite the first end portion, the through electrode being electrically connected to the circuit part and being disposed in the through portion, and the through electrode completely filling the portion of the through portion in which it is formed such that a bottom surface of the through electrode is exposed by the recess part, and
a connection member completely filling the recess part so as to cover the bottom surface of the through electrode and be electrically connected with the second end portion opposite to the first end portion of the through electrode; and
a substrate over which the semiconductor chip module is mounted.

2. The stacked semiconductor package according to claim 1, wherein the first end portion of the through electrode of any one of the at least two semiconductor chips is covered by the connection member of an adjacent one of the at least two semiconductor chips.

3. The stacked semiconductor package according to claim 1, wherein the connection member covers an exposing portion of the through electrode in the recess part.

4. The stacked semiconductor package according to claim 1, wherein the connection member includes a solder.

5. The stacked semiconductor package according to claim 1, wherein the connection member includes a resin and conductive balls included in the resin.

6. The stacked semiconductor package according to claim 1, wherein the recess part is formed in a shape such that a portion of the semiconductor chip body corresponding to the recess part has a curved surface.

7. The stacked semiconductor package according to claim 1, wherein the recess part is formed in a shape such that a portion of the semiconductor chip body corresponding to the recess part has a flat surface.

8. The stacked semiconductor package according to claim 1, wherein the first end portion of the through electrode is projected from the first face.

9. The stacked semiconductor package according to claim 1, wherein the semiconductor chips stacked over the substrate are in direct contact with each other.

10. The stacked package according to claim 1, wherein a bottommost semiconductor chip of the at least two semiconductor chips is mounted directly to the substrate, and the connection member of the bottommost semiconductor chip faces the substrate.

* * * * *